US012757660B2

(12) United States Patent
Dole et al.

(10) Patent No.: US 12,757,660 B2
(45) Date of Patent: *Oct. 6, 2026

(54) METHOD FOR ETCHING AN ETCH LAYER

(71) Applicant: Lam Research Corporation, Fremont, CA (US)

(72) Inventors: Nikhil Dole, Castro Valley, CA (US); Takumi Yanagawa, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 82 days.

This patent is subject to a terminal disclaimer.

(21) Appl. No.: 18/662,672

(22) Filed: May 13, 2024

(65) Prior Publication Data

US 2024/0297050 A1 Sep. 5, 2024

Related U.S. Application Data

(62) Division of application No. 17/289,603, filed as application No. PCT/US2019/058487 on Oct. 29, 2019, now Pat. No. 12,020,944.

(Continued)

(51) Int. Cl.

*H10P 50/28* (2026.01)
*C23C 16/455* (2006.01)

(Continued)

(52) U.S. Cl.

CPC ...... *H10P 50/283* (2026.01); *C23C 16/45542* (2013.01); *C23C 16/56* (2013.01);

(Continued)

(58) Field of Classification Search

None

See application file for complete search history.

(56) References Cited

U.S. PATENT DOCUMENTS 9,673,058 B1 6/2017 Briggs et al.
9,842,734 B2 12/2017 Delabie et al.

(Continued)

FOREIGN PATENT DOCUMENTS

CN 105990108 10/2016
CN 106898542 6/2017

(Continued)

OTHER PUBLICATIONS

Chinese Second Office Action form Chinses Application No. 201980072844.8 dated Jan. 21, 2025 with Machine Translation.

(Continued)

*Primary Examiner* — Roberts P Culbert

(74) *Attorney, Agent, or Firm* — Beyer Law Group LLP

(57) ABSTRACT

A method of etching features in a stack comprising a dielectric material on a substrate is provided. In a step (a) an etch plasma is generated from an etch gas, exposing the stack to the etch plasma, and partially etching features in the stack. In a step (b) after step (a) an atomic layer deposition process is provided to deposit a protective film on sidewalls. The atomic layer deposition process comprises a plurality of cycles, wherein each cycle comprises exposing the stack to a first reactant gas comprising $WF_6$, wherein the first reactant gas is adsorbed onto the stack and exposing the stack to a plasma formed from a second reactant gas, wherein the plasma formed from the second reactant gas reacts with the adsorbed first reactant gas to form the protective film over the stack. In a step (c) steps (a)-(b) are repeated at least one time.

10 Claims, 5 Drawing Sheets

Related U.S. Application Data

(60) Provisional application No. 62/755,707, filed on Nov. 5, 2018.

(51) Int. Cl.
*C23C 16/56* (2006.01)
*H01J 37/32* (2006.01)
*H10P 50/00* (2026.01)

(52) U.S. Cl.
CPC .. *H01J 37/32082* (2013.01); *H01J 37/32449* (2013.01); *H01J 37/32834* (2013.01); *H10P 50/73* (2026.01); *H01J 2237/2001* (2013.01); *H01J 2237/332* (2013.01); *H01J 2237/334* (2013.01)

(56) References Cited

U.S. PATENT DOCUMENTS

| | | | |
|---|---|---|---|
| 10,027,773 | B2 | 7/2018 | Seth et al. |
| 10,170,323 | B2 | 1/2019 | Hudson et al. |
| 10,381,236 | B2 | 8/2019 | Kihara et al. |
| 10,431,458 | B2 | 10/2019 | Hudson et al. |
| 10,490,415 | B2 | 11/2019 | Imamura et al. |
| 10,566,187 | B2 | 2/2020 | Qian et al. |
| 10,658,194 | B2 | 5/2020 | Tan et al. |
| 12,020,944 | B2 | 6/2024 | Dole et al. |
| 12,227,840 | B2 | 2/2025 | Gaff et al. |
| 2004/0216667 | A1 | 11/2004 | Mitsuhashi et al. |
| 2008/0118758 | A1 | 5/2008 | Kim et al. |
| 2012/0309181 | A1 | 12/2012 | Machkaoutsan et al. |
| 2016/0276148 | A1 | 9/2016 | Qian et al. |
| 2017/0037513 | A1 | 2/2017 | Haukka et al. |
| 2017/0076945 | A1 | 3/2017 | Hudson et al. |
| 2017/0178905 | A1 | 6/2017 | Delabie et al. |
| 2017/0271170 | A1* | 9/2017 | Omura .............. H01L 21/31116 |
| 2018/0174858 | A1 | 6/2018 | Hudson |
| 2021/0335624 | A1 | 10/2021 | Dole et al. |
| 2021/0343520 | A1 | 11/2021 | Qian et al. |

FOREIGN PATENT DOCUMENTS

| | | |
|---|---|---|
| JP | 2017-163032 | 9/2017 |
| JP | 2018-98497 | 6/2018 |
| KR | 2016-0068002 | 6/2016 |
| KR | 2016-0113014 | 9/2016 |
| KR | 10-2017-0028259 | 3/2017 |
| KR | 2017-0106927 | 9/2017 |
| KR | 2018-0022572 | 3/2018 |
| KR | 2018-0040084 | 4/2018 |
| KR | 10-2018-0117057 | 10/2018 |
| TW | 201712140 | 4/2017 |

OTHER PUBLICATIONS

International Search Report from International Application No. PCT/US2019/058487 dated Feb. 19, 2020.

Written Opinion from International Application No. PCT/US2019/058487 dated Feb. 19, 2020.

Korean Office Action from Korean Application No. 10-2020-7006763 dated Jul. 30, 2021.

Decision for Grant of Patent from Korean Application No. 2020-7006763 dated Feb. 28, 2022.

Taiwanese Office Action dated Oct. 2, 2023 from Taiwanese Application No. 109106716 with Machine Translation.

Office Action from U.S. Appl. No. 17/289,603 dated Aug. 3, 2023.

Notice of Allowance from U.S. Appl. No. 17/289,603 dated Feb. 14, 2024.

Chinese First Office Action for Chinese Application No. 201980072844.8 dated Jun. 12, 2024 with machine translation.

Japanese Notice of Reasons for Refusal for Japanese Application No. 2021-523848 dated Oct. 31, 2023 with machine translation.

Japanese Decision of Refusal for Japanese Application No. 2021-523848 dated Apr. 9, 2024 with machine translation.

Korean Notice of Allowance for Korean Application No. 10-2020-7006763 dated Feb. 28, 2022 with partial machine translation.

Taiwanese Office Action for Taiwanese Application No. 109106716 dated Feb. 19, 2021 with machine translation.

Taiwanese Office Action for Taiwanese Application No. 109106716 dated Jul. 16, 2021 with machine translation.

Notice of Refusal from Japanese Application No. 2024-131827 dated Jul. 29, 2025 with Machine Translation.

Chinese Notice of Allowance from Chinese Application No. 201980072844.8 dated May 30, 2025 with Machine Translation.

* cited by examiner

METHOD FOR ETCHING AN ETCH LAYER

CROSS REFERENCE TO RELATED APPLICATIONS

This application is a divisional of U.S. application Ser. No. 17/289,603 filed Apr. 28, 2021, which is a 371 of international Application No. PCT/US2019/058487 filed Oct. 29, 2019, which claims the benefit of priority of U.S. Application No. 62/755,707, filed Nov. 5, 2018, which is incorporated herein by reference for all purposes.

BACKGROUND

The disclosure relates to methods of forming semiconductor devices on a semiconductor wafer. More specifically, the disclosure relates to etching recessed features in an etch layer in a stack.

In forming semiconductor devices, etch layers may be etched to form contact holes or trenches. Some semiconductor devices may be formed by etching silicon oxide ($SiO_2$) based layers.

SUMMARY

To achieve the foregoing and in accordance with the purpose of the present disclosure, a method of etching features in a stack comprising a dielectric material on a substrate is provided. In a step (a), an etch plasma is generated from an etch gas, exposing the stack to the etch plasma, and partially etching features in the stack. In a step (b) after step (a), an atomic layer deposition process is provided to deposit a protective film on sidewalls. The atomic layer deposition process comprises a plurality of cycles, wherein each cycle comprises exposing the stack to a first reactant gas comprising $WF_6$, wherein the first reactant gas is adsorbed onto the stack and exposing the stack to a plasma formed from a second reactant gas, wherein the plasma formed from the second reactant gas reacts with the adsorbed first reactant gas to form the protective film over the stack. In a step (c), steps (a)-(b) are repeated at least one time.

In another manifestation, an apparatus for etching features in a stack is provided. A process chamber is provided. A substrate support is within the process chamber. A gas inlet provides a gas into the process chamber. A gas source provides the gas to the gas inlet, where the gas source comprises an etch gas source, a $WF_6$ gas source, and a reactant gas source. An exhaust pump is provided for pumping gas from the process chamber. An electrode provides RF power in the process chamber. At least one power source provides power to the electrode. A controller is controllably connected to the gas source and the at least one power source, wherein the controller comprises at least one processor and computer readable media. The computer readable media comprises computer code for effecting etching a stack via a first plurality of cycles, wherein each of the first plurality of cycles comprises partially etching the stack and depositing by atomic layer deposition a layer on the stack by providing a second plurality of cycles. Each of the cycles of the second plurality of cycles, comprises flowing a $WF_6$ containing gas from the $WF_6$ gas source, adsorbing the $WF_6$ containing gas onto the stack, stopping the flow of the $WF_6$ containing gas, and exposing the stack to a plasma of a reactant gas from the reactant gas source, wherein the plasma converts the adsorbed $WF_6$ containing gas into an atomic layer deposition layer.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

A high aspect ratio etch requires maintaining a vertical profile with minimum lateral CD (critical dimension) growth (CD bowing). In addition, profile trade-offs, such as decreased mask selectivity, decreased etch rate, or capping/clogging of the features should be avoided. CD bowing is caused by etching of sidewalls of the features. A passivation layer may be placed over the sidewalls to reduce CD bowing. Some methods deposit a sidewall passivation at a temperature above 250° C. to provide a uniform passivation. Such a high temperature may damage semiconductor devices.

Figure 1:
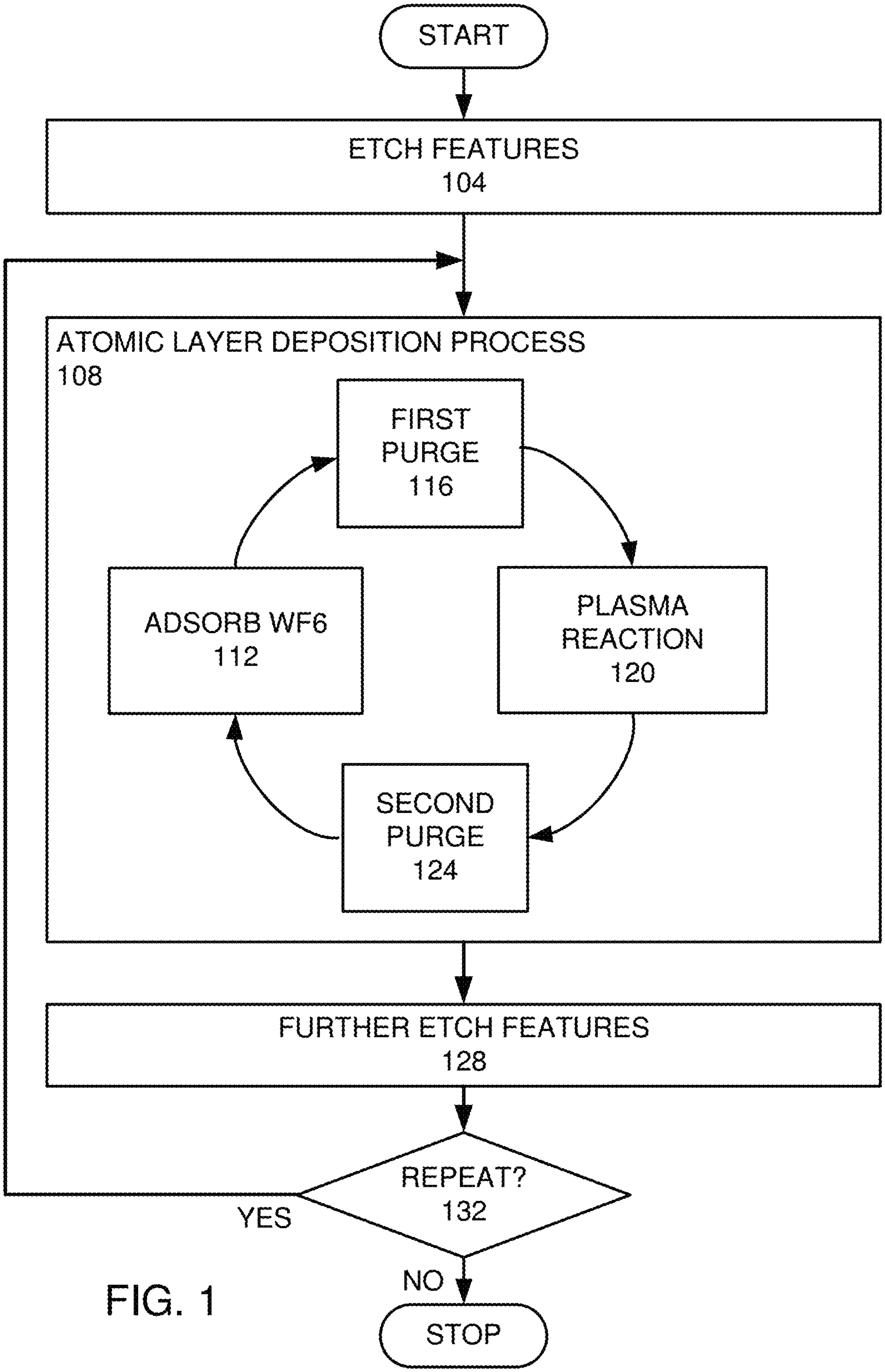
FIG. 1 is a high level flow chart of an embodiment.
Figure 2A:
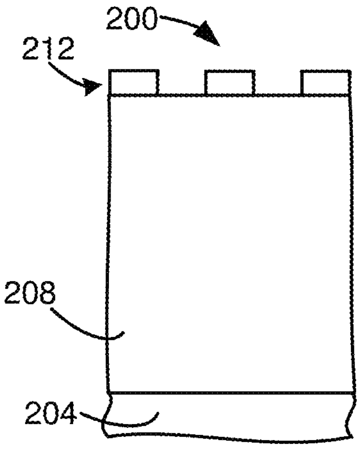
FIGS. 2A-G are schematic illustrations of a stack processed according to an embodiment.

In an example of an embodiment, FIG. 1 is a high level flow chart of an embodiment. The embodiment may be used to process a stack 200, as illustrated in FIG. 2A. FIG. 2A is a cross sectional view of a stack 200 with a substrate 204 disposed below an etch layer 208, disposed below a mask 212. In this example, the mask 212 is a hardmask, such as a plasma enhanced chemical vapor deposition (PECVD) amorphous carbon mask. In this example, the etch layer 208 is a dielectric layer made of a dielectric material, such as silicon oxide ($SiO_2$). One or more layers (not shown) may be disposed between the substrate 204 and the etch layer 208. One or more layers (not shown) may also be disposed between the etch layer 208 and the mask 212.

Figure 2B:
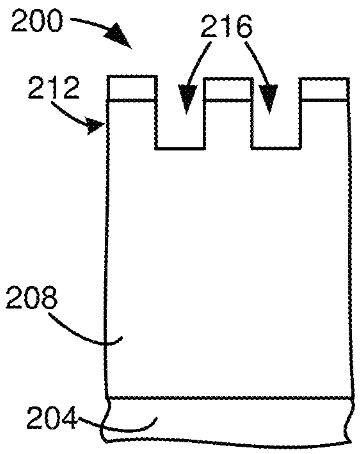

Features are partially etched into an etch layer 208 (step 104). An example of a recipe for partially etching features into the etch layer 208 (step 104) provides a pressure of 5-50 mTorr. Radio frequency (RF) power is provided at a frequency of 60 megahertz (MHz) at a power of 500 watts (W)-10 kilowatts (kW) and at a frequency of 400 kilohertz (kHz) at a power of 1 kW-30 kW. The RF power is pulsed between these powers levels. An etch gas is provided. The etch gas comprises oxygen ($O_2$), fluorocarbon(s) and/or hydrofluorocarbon(s). The etch gas is formed into a plasma by the RF power. The plasma provides radical ions responsible for the high aspect ratio etch. Such a plasma is called an etch plasma in the specification and claims. When the partial etch is complete, the flow of the etch gas is stopped. The RF power is stopped or reduced so that a plasma is not generated. FIG. 2B is a cross sectional view of a stack 200 after features 216 have been partially etched.

After the partial etching (step 104), an atomic layer deposition process is provided (step 108) to deposit a protective film on sidewalls of the features 216. The atomic layer deposition process (step 108) comprises a cyclical process with multiple cycles. In a first phase of a cycle of the atomic layer deposition process (step 108), the stack 200 is exposed to a first reactant gas comprising tungsten hexafluoride ($WF_6$) (step 112). A flow of a gas comprising 0.5 to 200 sccm of $WF_6$ is provided. In this embodiment, the first reactant gas is not transformed into a plasma. As a result, this step is plasmaless. A stack temperature is maintained at a temperature in the range of 40° C. to 80° C. The first reactant gas is adsorbed onto the surfaces of the stack 200. After 3 seconds, the flow of the first reactant gas is stopped.

Figure 2C:
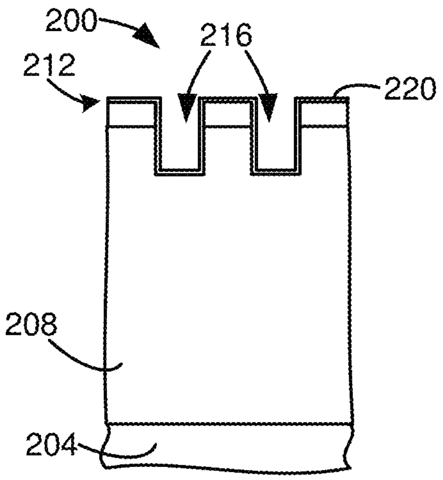

Without being bound by theory, it is believed that the $WF_6$ chemically reacts with $SiO_2$ to form a layer of oxidized tungsten silicide (SiOW). FIG. 2C is a cross sectional view of the stack 200 after a layer of SiOW 220 has been formed on the surfaces (including the sidewalls) of the features 216. The layer of SiOW 220 is not drawn to scale, but is shown to be much thicker in order to better illustrate the layer of SiOW 220.

After the first reactant gas is adsorbed (step 112), a first purge is provided (step 116) to purge the first reactant gas. In this example, the first purge is provided by flowing $O_2$ into the plasma processing chamber. Other embodiments may have a purge gas of pure nitrogen ($N_2$), or a mixture of $N_2$ and argon (Ar), or pure Ar. A purge gas of $O_2$ allows a plasma to be struck immediately after the first purge. The flow of the purge gas is stopped after 5 seconds. The first purge completely removes tungsten (W) that has not been adsorbed before a plasma is formed in the next step.

After the first purge is completed (step 116), the stack 200 is exposed to a plasma formed from a second reactant gas (step 120). The stack 200 and chamber are maintained at a temperature below 150° C. A second reactant gas is provided. In this example, the second reactant gas is $O_2$. The second reactant gas is formed into a plasma by providing excitation energy at a frequency of 60 MHz at a power in the range of 200 W to 20 kW. A bias RF signal is provided at a frequency of between 100 kHz and 27 MHz at a power in the range of 200 W to 50 kW. After 3 seconds, the plasma is extinguished.

After the stack 200 is exposed to a plasma formed from the second reactant gas (step 120), a second purge is provided (step 124) to purge remaining plasma ion radicals. In this example, the second purge is provided by flowing the second reactant gas into the plasma processing chamber without sufficient RF power to form a plasma. The second reactant gas is used to purge remaining plasma. Other embodiments may have other purge gases. Some embodiments may stop the RF power. The flow of the purge gas is stopped after 5 seconds. The second purge completely removes plasma ion radicals from the plasma processing chamber. The atomic layer deposition cycle is then repeated. In this example, the atomic layer deposition process (step 108) is performed for 3 to 100 cycles.

Figure 2D:
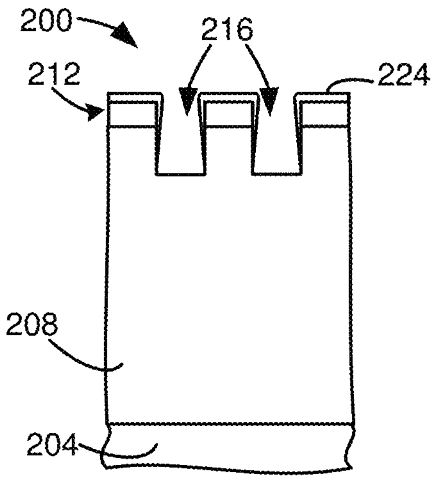

FIG. 2D is a cross sectional view of a stack 200 after a plurality cycles of the atomic layer deposition process (step 108) is provided to form a protective film 224 on sidewalls of the features 216. In this example, the protective film 224 comprises a tungsten oxide. The protective film 224 is not drawn to scale. Since the atomic layer deposition process (step 108) uses a plasma instead of a plasma free thermal process, the protective film 224 is not as conformal as a film deposited using a plasma free thermal process. In addition, the protective film 224 may not be as high a quality as a film deposited using a plasma free thermal process. Because the protective film 224 is not conformal, in this embodiment, the protective film 224 does not extend to the bottom of the features 216.

Figure 2E:
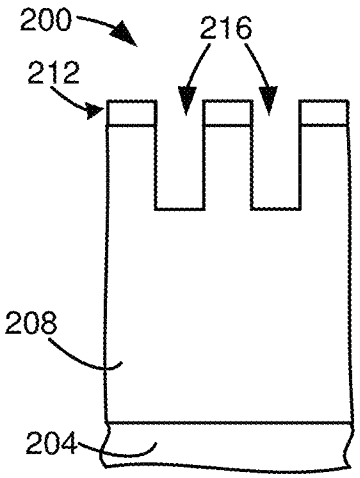

After the atomic layer deposition process (step 108) is completed, the features 216 are further etched (step 128). An example of a recipe for further etching features into the etch layer 208 provides a pressure of 5-50 mTorr. RF power is provided at a frequency of 60 MHz at a power of 2 kW-8 kW and at a frequency of 400 kHz at a power of 4 kW-25 kW. The RF power is pulsed between these powers levels. An etch gas is provided. The etch gas comprises $O_2$, fluorocarbon(s) and/or hydrofluorocarbon(s). The etch gas is formed into an etch plasma by the RF power. FIG. 2E is a cross sectional view of the stack 200 after the features 216 have been further etched.

Figure 2F:
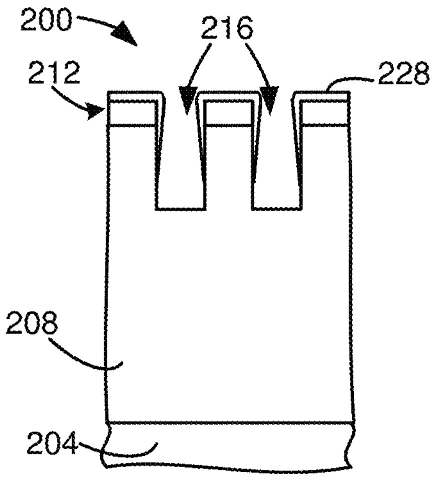

If the etching of the features is not complete (step 132) (i.e., the features are not etched to a final depth), the process returns to the atomic layer deposition process (step 108). The atomic layer deposition process (step 108) is repeated. FIG. 2F is a cross sectional view of the stack 200 after the atomic layer deposition process (step 108) is repeated and a new protective film 228 is formed. Since the new protective film 228 is formed using a plasma, the new protective film is not conformal.

Figure 2G:
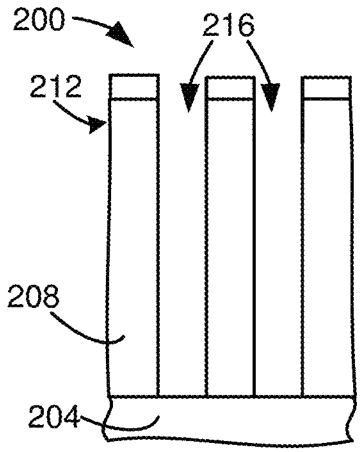

The features 216 are further etched (step 128). The cycles of atomic layer deposition process (step 108) and the further etching (step 128) are repeated until the etching of the features 216 is completed (step 132). FIG. 2G is a cross sectional view of the stack 200 after the etching of the features 216 is etched to a final depth.

The above embodiment provides sidewall passivation that prevents or reduces feature bowing, by using a plasma during the atomic layer deposition process (step 108). If a thermal atomic layer deposition process is used to deposit tungsten, a stack or chamber temperature above 250° C. would be used. A temperature above 250° C. may damage the semiconductor devices being formed. The atomic layer deposition process (step 108), using a plasma to deposit a tungsten containing protective film, provides a less conformal and lower quality protective film. However, it has been found that the tungsten containing nonconformal protective film is sufficient for preventing or reducing sidewall bowing.

In various embodiments, the atomic layer deposition process (step 108) is performed with a stack or chamber temperature of less than 100° C. In various embodiments, the plasma formed by the second reactant gas provides either an oxidation or a nitridation. If the plasma from the second reactant gas provides an oxidation, then in various embodiments, the second reactant gas comprises an oxygen containing component, such as at least one of oxygen ($O_2$), ozone ($O_3$), carbonyl sulfide (COS), carbon dioxide ($CO_2$), sulfur dioxide ($SO_2$), or carbon monoxide (CO). In addition, argon (Ar) or krypton (Kr) may be used as a carrier gas. If the plasma from the second reactant gas provides a nitridation, the second reactant gas comprises a nitrogen containing component, such as at least one of nitrogen ($N_2$) or ammonia ($NH_3$). In addition, Ar or Kr may be used as a carrier gas. If the second reactant gas comprises $N_2$, then the second reactant gas may further comprise $H_2$.

In various embodiments, the hardmask may be formed from amorphous carbon, boron doped carbon, boron doped silicon, metal doped carbon, or polysilicon. In various embodiments, the etch layer 208 is a silicon oxide based dielectric layer. In various embodiments, the etch layer 208 is a stack of different layers of material. In various embodiments, at least one layer of the etch layer 208 is a layer of dielectric material. In various embodiments, the atomic layer deposition process (step 108), provides a protective film 228 that is nonconformal and does not reach bottoms of the features 216. In various embodiments, the RF power may be a continuous wave. In other embodiments, the RF power may be a pulsed power. In various embodiments, the pulsed RF power may have a pulse repetition rate between 100 Hz and 5 kHz. In various embodiments, the pulsed RF power may have a duty cycle between 5% to 95%.

In addition, the atomic layer deposition process (step 108) may be performed in-situ in the same plasma processing chamber as the etch process (step 128), since the atomic layer deposition process (step 108) uses a plasma instead of a thermal process. By providing an in-situ atomic layer deposition process (step 108), throughput is much higher, since all steps are performed in the same plasma processing chamber.

Figure 3:
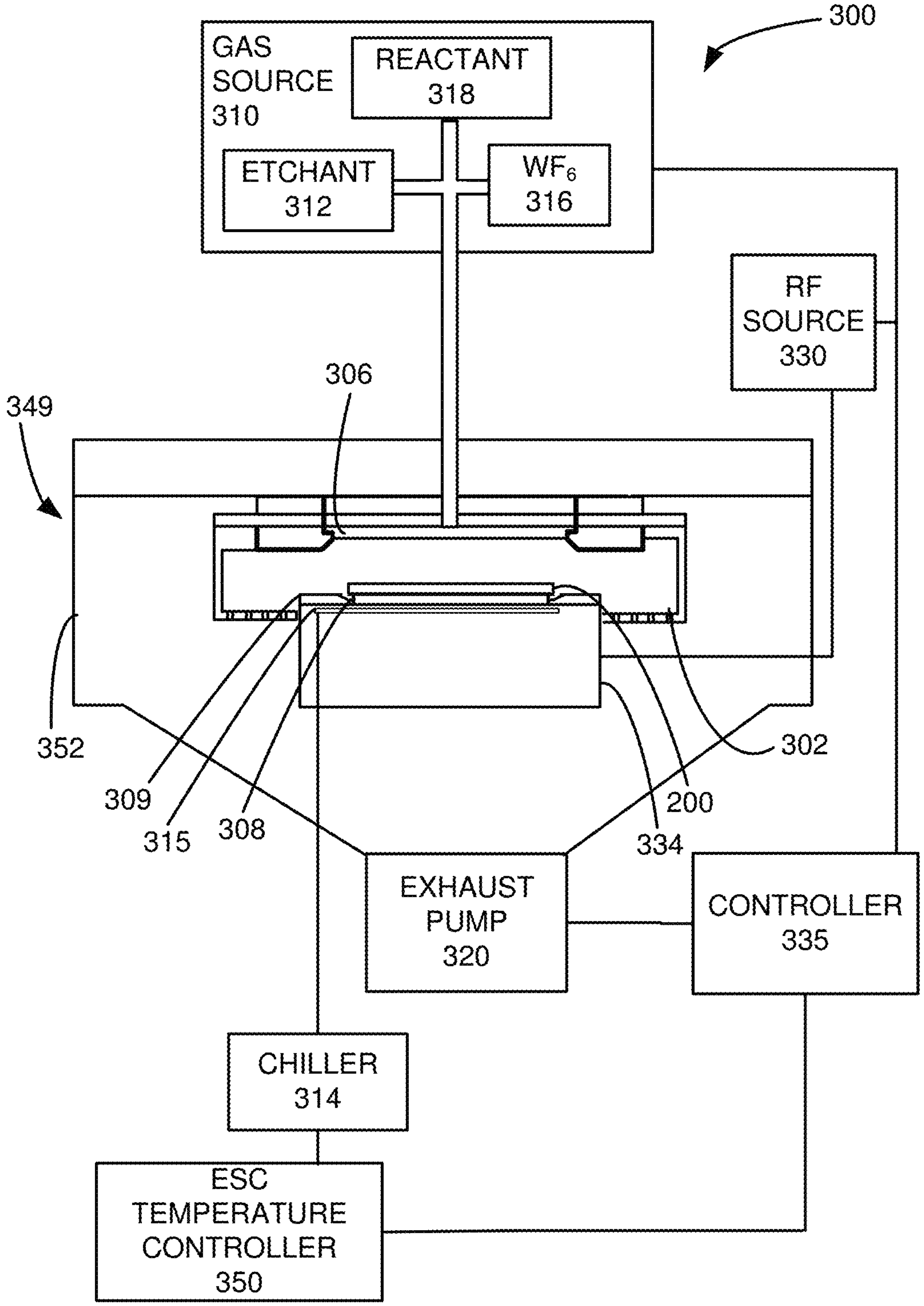
FIG. 3 is a schematic view of a etch chamber that may be used in an embodiment.

In an exemplary embodiment, FIG. 3 is a schematic view of an etch reactor that may be used in an embodiment. In one or more embodiments, a plasma processing chamber 300 comprises a gas distribution plate 306 providing a gas inlet and an electrostatic chuck (ESC) 308, within an etch chamber 349, enclosed by a chamber wall 352. Within the etch chamber 349, a stack 200 is positioned over the ESC 308. The ESC 308 is also a substrate support. An edge ring 309 surrounds the ESC 308. A gas source 310 is connected to the etch chamber 349 through the gas distribution plate 306. In this example, the gas source 310 comprises An etchant gas source 312, a $WF_6$ gas source 316, and a reactant gas source 318. An ESC temperature controller 350 is connected to a chiller 314. In this embodiment, the chiller 314 provides a coolant to channels 315 in or near the ESC 308 in order to cool the ESC 308. A radio frequency (RF) source 330 provides RF power to a lower electrode. In this embodiment, the ESC 308 is the lower electrode. In an exemplary embodiment, 400 kHz and 60 MHz power sources make up the RF source 330. In this embodiment, an upper electrode, the gas distribution plate 306, is grounded. In this embodiment, one generator is provided for each frequency. Other arrangements of RF sources and electrodes may be used in other embodiments. A controller 335 is controllably connected to the RF source 330, an exhaust pump 320, and the gas source 310. An example of such an etch chamber is the Flex® etch system manufactured by Lam Research Corporation of Fremont, CA. The process chamber can be a CCP (capacitive coupled plasma) reactor or an ICP (inductive coupled plasma) reactor.

Figure 4:
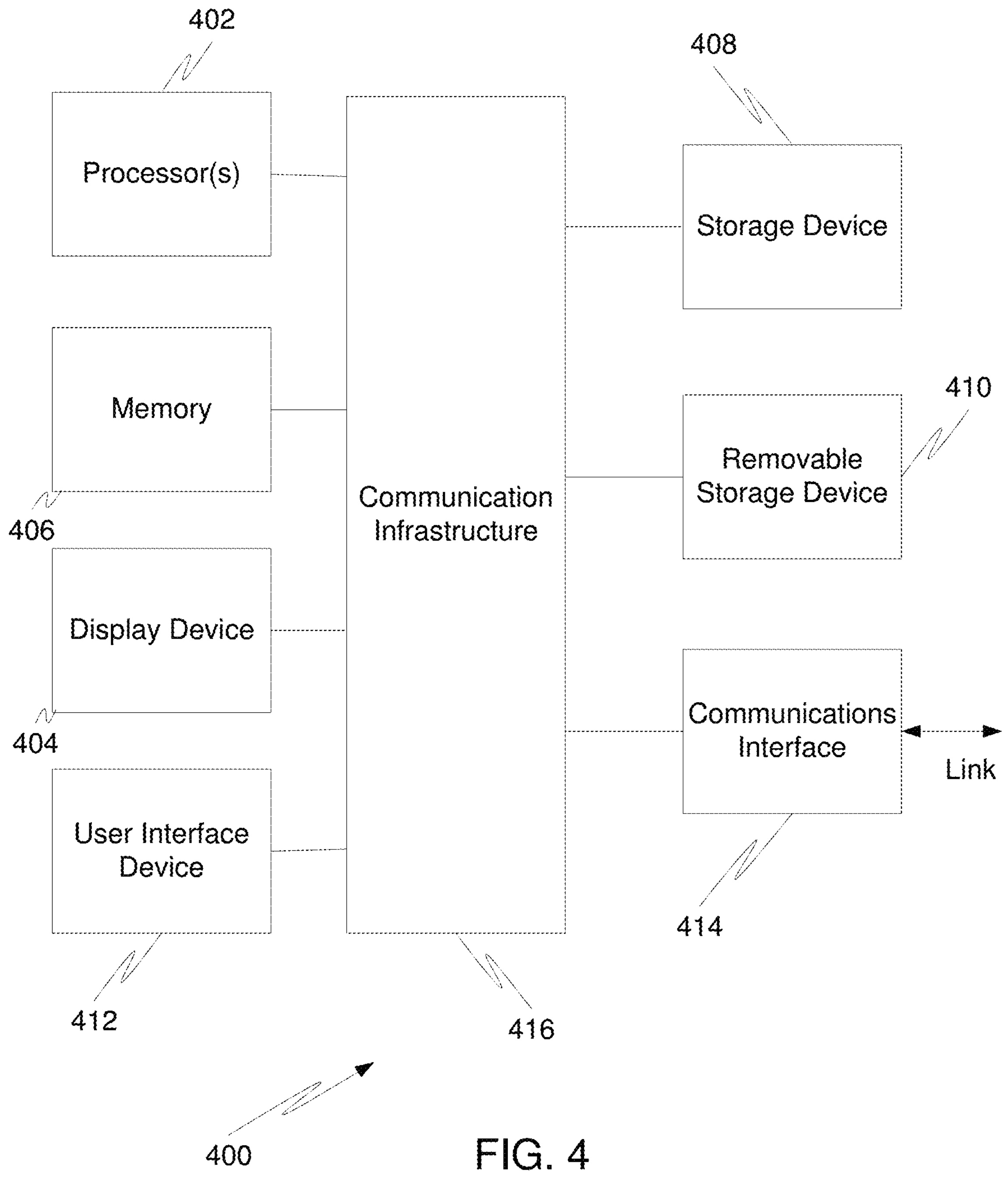
FIG. 4 is a schematic view of a computer system that may be used in practicing an embodiment.

FIG. 4 is a high level block diagram showing a computer system 400, which is suitable for implementing a controller 335 used in embodiments. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method of etching features in a stack comprising a dielectric material below a mask on a substrate, the method comprising:

(a) generating an etch plasma from an etch gas, exposing the stack to the etch plasma, and partially etching features in the stack in a plasma processing chamber;

(b) after (a) providing a deposition process performed in-situ in the plasma processing chamber to deposit a protective film comprising a plurality of cycles, wherein each cycle comprises:

(i) exposing the stack to a first reactant gas comprising $WF_6$, wherein the first reactant gas is adsorbed onto the stack; and (ii) exposing the stack to a plasma formed from a second reactant gas, wherein the plasma formed from the second reactant gas reacts with adsorbed first reactant gas to form the protective film over the stack, wherein the second reactant gas comprises an oxygen containing component to provide oxidation, wherein the deposition process further comprises maintaining a stack temperature below 150° C., wherein the providing the deposition provides a nonconformal atomic layer deposition process performed in-situ in the plasma processing chamber to deposit a nonconformal protective film that does not extend to bottoms of the features.

2. The method, as recited in claim 1, further comprising repeating (a)-(b) at least one time in-situ in the plasma processing chamber.

3. The method, as recited in claim 1, wherein the second reactant gas comprises at least one of COS, $CO_2$, CO, $SO_2$, $O_2$, or $O_3$.

4. The method, as recited in claim 1, wherein the stack comprises $SiO_2$.

5. The method, as recited in claim 4, wherein the stack further comprises a hardmask.

6. The method, as recited in claim 5, wherein the hardmask comprises one or more of amorphous carbon, boron doped carbon, metal doped carbon, or polysilicon.

7. The method, as recited in claim 1, wherein step (b) is performed for 2 to 100 cycles.

8. The method, as recited in claim 1, wherein each cycle further comprises:

purging the first reactant gas after exposing the stack to the first reactant gas and before exposing the stack to the plasma formed by the second reactant gas; and purging the plasma formed from the second reactant gas, after exposing the stack to the plasma formed from the second reactant gas.

9. The method, as recited in claim 1, wherein the exposing the stack to the first reactant gas is a plasmaless step.

10. The method, as recited in claim 1, wherein the providing the deposition, deposits on sidewalls of the partially etched features.

* * * * *